(12) United States Patent
Takeuchi et al.

(10) Patent No.: US 9,190,750 B2
(45) Date of Patent: Nov. 17, 2015

(54) BOARD-TO-BOARD CONNECTOR

(75) Inventors: Ryotaro Takeuchi, Kanagawa (JP); Toru Suzuki, Kanagawa (JP)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 13/395,466

(22) PCT Filed: Sep. 13, 2010

(86) PCT No.: PCT/US2010/048669
§ 371 (c)(1),
(2), (4) Date: May 18, 2012

(87) PCT Pub. No.: WO2011/032106
PCT Pub. Date: Mar. 17, 2011

(65) Prior Publication Data
US 2012/0231637 A1 Sep. 13, 2012

(30) Foreign Application Priority Data
Sep. 11, 2009 (JP) .................. 2009-210528

(51) Int. Cl.
*H01R 12/00* (2006.01)
*H01R 12/71* (2011.01)
*H05K 3/36* (2006.01)

(52) U.S. Cl.
CPC .............. *H01R 12/716* (2013.01); *H05K 3/368* (2013.01); *H05K 2201/10189* (2013.01)

(58) Field of Classification Search
CPC ........................... H01R 23/725; H01R 23/684

USPC ........ 439/74, 71, 70, 330, 331, 525, 526, 357
See application file for complete search history.

(56) References Cited

U.S. PATENT DOCUMENTS

| 5,395,250 | A | 3/1995 | Englert, Jr. et al. |
| 7,090,508 | B1 | 8/2006 | Chen |
| 7,128,581 | B2 | 10/2006 | Igarashi et al. |
| 2008/0207014 | A1* | 8/2008 | Takeuchi et al. ................ 439/74 |
| 2010/0248524 | A1* | 9/2010 | Miyazaki et al. ............. 439/357 |

FOREIGN PATENT DOCUMENTS

| JP | 2004-055306 | 2/2004 |
| JP | 2007-095371 | 4/2007 |

OTHER PUBLICATIONS

International Search Report for PCT/US2010/48669.

* cited by examiner

*Primary Examiner* — Phuongchi T Nguyen

(57) ABSTRACT

A board-to-board connector has such a configuration that at least one a first reinforcing bracket of a first connector and a second reinforcing bracket of a second connector is provided with a bent portion having a crank shape, viewed from the insertion/removal direction of the first and second connectors. Owing to such a configuration, deformation of the first reinforcing bracket and/or the second reinforcing bracket can be prevented, and a firm engagement state between the first and second reinforcing brackets is achieved. As a result, a strong removal force is required for releasing the engagement state, and a stable engagement between the first connector and the second connector can be maintained.

11 Claims, 8 Drawing Sheets

BOARD-TO-BOARD CONNECTOR

REFERENCE TO RELATED APPLICATIONS

The Present Application claims priority to prior-filed Japanese Patent Application No. 2009-210528, entitled "Board-To-Board Connector," and filed 11 Sep. 2009, the contents of which is fully incorporated in its entirety herein.

BACKGROUND OF THE PRESENT APPLICATION

The Present Application relates generally to a board-to-board connector, and, more particularly, to a board-to-board connector having a strong removal force for releasing the engagement state and a stable engagement between a first and second connector.

Conventional board-to-board connectors have been used for electrically connecting a pair of parallel circuit boards. Such connectors are attached, by fitting, to respective opposing surfaces of the pair of circuit boards so that they are electrically connected to each other. Moreover, a technique has already been proposed in which reinforcing brackets attached to both ends of a board-to-board connector are configured to function as a locking member so that a state of being engaged with a counterpart connector is maintained. An example of a typical board-to-board connector is disclosed in Japanese Patent Application No. 2004-55306.

FIG. 8 is a perspective view of reinforcing brackets of a conventional board-to-board connector. Referring to FIG. 8B, a first housing designated by reference numeral 811 is a housing of a first connector mounted in a non-illustrated, first circuit board, and referring to FIG. 8A, a second housing designated by reference numeral 911 is a housing of a second connector mounted in a non-illustrated, second circuit board. A plurality of non-illustrated first terminals is mounted in the first housing 811, and a plurality of non-illustrated second terminals is mounted in the second housing 911. When the first connector and the second connector are engaged together by fitting, corresponding ones of the first terminals and the second terminals are brought into contact with each other, so that the first circuit board and the second circuit board are electrically connected to each other.

Furthermore, first bracket accommodation-concave portions 826 having a groove shape are formed on both end portions in the longitudinal direction of the first housing 811, and first reinforcing brackets 851 are attached to the first housing 811 by being press-fitted into the first bracket accommodation-concave portions 826. The first reinforcing brackets 851 are an integral member formed by applying processing, e.g., punching and bending, to a metal plate. Each of the first reinforcing brackets 851 is provided with a body portion 852, fixing leg portions 856 which are extended downwardly from both ends of the body portion 852 to be soldered to the first circuit board, a pair of projection pieces 857 which are extended downwardly from the body portion 852, an elastic piece 853 which is formed between the projection pieces 857, and a locking projection 854 which projects outwardly from an inner surface of the elastic piece 853.

Similarly, second reinforcing brackets 951 are attached to the left and right sides of each of both ends in the longitudinal direction of the second housing 911. The second reinforcing brackets 951 are an integral member formed by applying processing, e.g., punching and bending, to a metal plate. Each of the second reinforcing brackets 951 is provided with a body portion 952, fixing leg portions 956 which are extended downwardly from both ends of the body portion 952 to be soldered to the second circuit board, and a locking projection 954 which projects outwardly from the body portion 952.

When the first connector and the second connector are engaged together by fitting, the locking projections 854 of the first reinforcing brackets 851 are engaged with the locking projections 954 of the second reinforcing brackets 951. In this way, the first connector and the second connector are locked and their engagement state is maintained. When the first connector and the second connector are engaged together by fitting, either one of the first housing 811 and the second housing 911 is engaged with the other housing in a reversed position (upside down) from the illustrated position.

However, in the above-mentioned conventional board-to-board connector, since the first reinforcing brackets 851 and/or the second reinforcing brackets 951 are deformed elastically, it is difficult to lock the first connector and the second connector together with a sufficiently strong force even when the locking projections 854 of the first reinforcing brackets 851 are engaged with the locking projections 954 of the second reinforcing brackets 951. That is to say, when a removal force which is a force that releases the engagement between the first connector and the second connector is applied to the first connector and/or the second connector, the body portion 852 of each of the first reinforcing brackets 851 and/or the body portion 952 of each of the second reinforcing brackets 951 is torsionally deformed. Thus, the engagement between the locking projections 854 of the first reinforcing brackets 851 and the locking projections 954 of the second reinforcing brackets 951 is easily released. Particularly, in the case of the first reinforcing brackets 851, since the span between the leg portions 856 formed at both ends of the body portion 852 is large, the amount of torsional deformation at the center of the body portion 852 becomes large. As a result, the amount of displacement of the locking projections 854 increases, so that the locking projections 854 are easily separated from the locking projections 954 of the second reinforcing brackets 951.

SUMMARY OF THE PRESENT APPLICATION

Therefore, it is an object of the Present Application to obviate the above-described problems encountered by the conventional board-to-board connector and to provide a board-to-board connector having such a configuration that at least one of first reinforcing brackets of a first connector and second reinforcing brackets of a second connector is provided with a bent portion having a crank shape as viewed from an insertion/removal direction of the first and second connectors, so that deformation of the first reinforcing brackets and/or the second reinforcing brackets can be prevented, and a firm engagement state between the first reinforcing brackets and the second reinforcing brackets is achieved. As a result, a strong removal force is required for releasing the engagement state, and a stable engagement between the first connector and the second connector can be maintained. Accordingly, it is possible to provide good operability and high reliability for the board-to-board connector.

Therefore, in accordance with the Present Application, a board-to-board connector is provided which comprises: a first connector having first terminals, a first housing which has a generally rectangular parallelepiped shape and is provided with concave insertion portions, and first reinforcing brackets which are arranged in the concave insertion portions; and a second connector having second terminals configured to make contact with the first terminals, a second housing which has a generally rectangular parallelepiped shape and is provided with convex insertion portions configured to be inserted in the concave insertion portions, and second reinforcing brackets which are arranged in the convex insertion portions and configured to be engaged with the first reinforcing brackets, wherein at least one of the first reinforcing brackets and the second reinforcing brackets is provided with a bent portion having a crank shape as viewed from an insertion/removal direction of the first and second connectors.

In accordance with another aspect of the Present Application, the board-to-board connector has such a configuration that each of the first reinforcing brackets is provided with a strip-shaped first body portion which is configured to extend in a width direction of the first housing and a first locking portion which is formed on the first body portion; each of the second reinforcing brackets is provided with a strip-shaped second body portion, which is configured to extend in a width direction of the second housing, and a second locking portion which is formed on the second body portion and which is configured to be engaged with the first locking portion; and one of the first locking portion and the second locking portion is a convex portion, and the other one is a concave portion or an opening portion.

In accordance with a further aspect of the Present Application, the board-to-board connector has such a configuration that the first and second locking portions are provided plural in number, respectively, and at least two of them are arranged horizontally symmetrically.

In accordance with a still further aspect of the Present Application, the board-to-board connector has such a configuration that each of the first reinforcing brackets is provided with first arm portions which are connected to both ends of the first body portion and configured to extend in the longitudinal direction of the first housing to be held in the first housing; and each of the second reinforcing brackets is provided with second arm portions which are connected to both ends of the second body portion and configured to extend in the longitudinal direction of the second housing to be held in the second housing.

In accordance with a still further aspect of the Present Application, the board-to-board connector has such a configuration that the first body portion is provided with a central portion formed with the first locking portion and configured to extend in a straight-line shape along the width direction of the first housing as viewed from the insertion/removal direction; a pair of the bent portions are connected to both ends of the central portion; and a pair of outer end portions are configured to extend in the width direction of the first housing from the bent portions.

In accordance with a still further aspect of the Present Application, the board-to-board connector has such a configuration that the concave insertion portions are formed at both ends in the longitudinal direction of the first housing; the first reinforcing brackets are arranged near the outer ends of each concave insertion portion; the convex insertion portions are formed at both ends in the longitudinal direction of the second housing; and the second reinforcing brackets are arranged along the outer ends in the longitudinal direction of each convex insertion portion.

In accordance with the Present Application, the board-to-board connector has such a configuration that at least one of the first reinforcing brackets of the first connector and the second reinforcing brackets of the second connector is provided with the bent portion having a crank shape as viewed from the insertion/removal direction of the first and second connectors. Owing to such a configuration, deformation of the first reinforcing brackets and/or the second reinforcing brackets can be prevented, and a firm engagement state between the first reinforcing brackets and the second reinforcing brackets is achieved. As a result, a strong removal force is required for releasing the engagement state, and a stable engagement between the first connector and the second connector can be maintained. Accordingly, the board-to-board connector has good operability and high reliability.

BRIEF DESCRIPTION OF THE FIGURES

The organization and manner of the structure and operation of the Present Application, together with further objects and advantages thereof, may best be understood by reference to the following Detailed Description, taken in connection with the accompanying Figures, wherein like reference numerals identify like elements, and in which:

FIGS. 6A and 6B are first cross-sectional views of the reinforcing brackets of the connectors, taken along Arrows A-A in FIG. 2, in which FIG. 6A illustrates a normal state, and FIG. 6B illustrates where a removal force is applied thereto;

FIGS. 7A and 7B are second cross-sectional views of the reinforcing brackets of the connectors, taken along Arrows B-B in FIG. 2, in which FIG. 7A illustrates a normal state, and FIG. 7B illustrates where a removal force is applied thereto.

DESCRIPTION OF THE PREFERRED EMBODIMENTS

Figure 1:
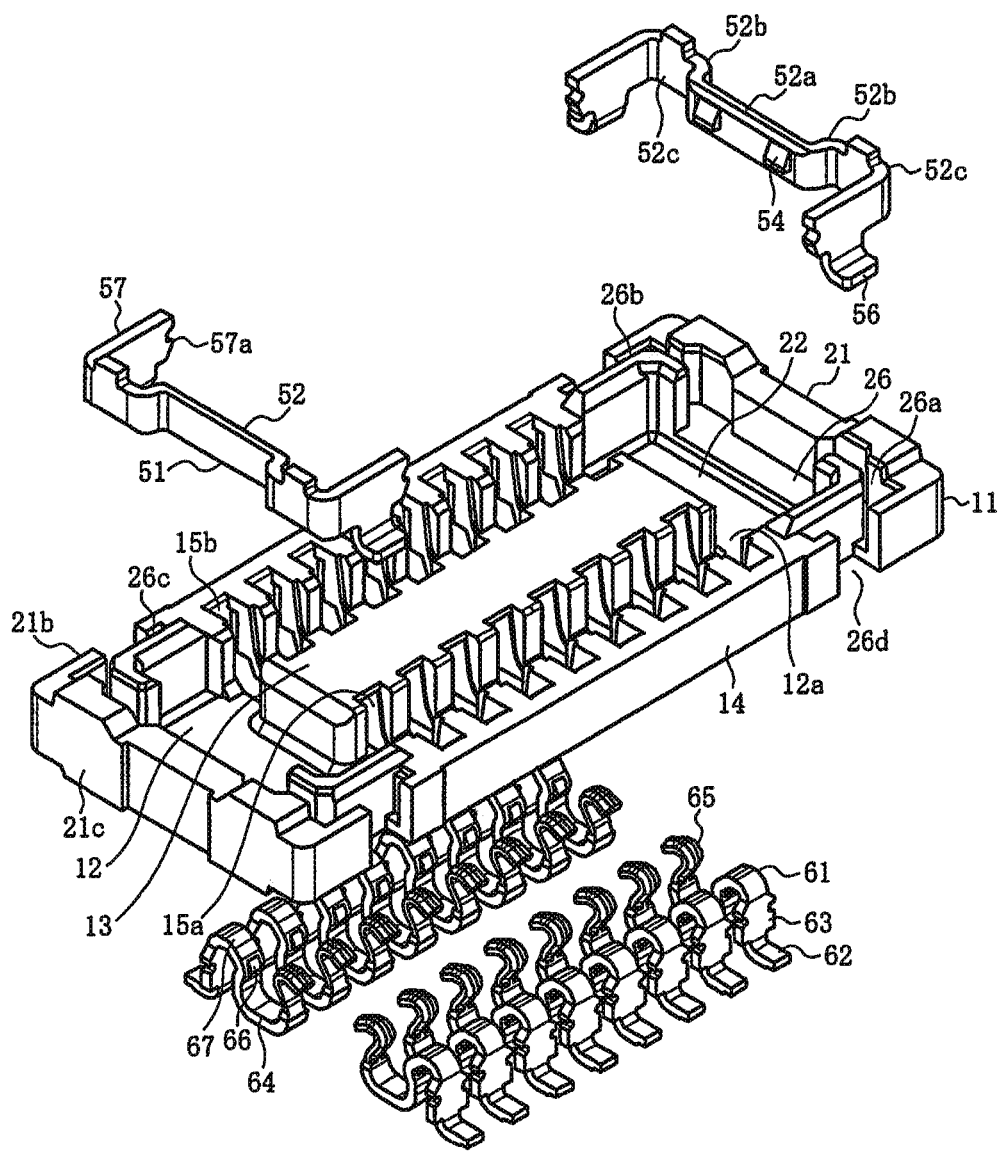
FIG. 1 is an exploded view of a first connector of a board-to-board connector according to the Present Application, viewed from a fitting face thereof.

While the Present Application may be susceptible to embodiment in different forms, there is shown in the Figures, and will be described herein in detail, specific embodiments, with the understanding that the disclosure is to be considered an exemplification of the principles of the Present Application, and is not intended to limit the Present Application to that as illustrated.

In the illustrated embodiments, directional representations—i.e., up, down, left, right, front, rear and the like, used for explaining the structure and movement of the various elements of the Present Application, are relative. These representations are appropriate when the elements are in the position shown in the Figures. If the description of the position of the elements changes, however, it is assumed that these representations are to be changed accordingly.

In the drawing figures, a first connector, as one of a pair of board-to-board connectors according to the present embodiment, generally designated by reference numeral 1, is a surface-mounted type connector, which is mounted on a surface of a non-illustrated first board. Moreover, a second connector, as the other one of the pair of board-to-board connectors according to the present embodiment, generally designated by reference numeral 101, is a surface-mounted type connector, which is mounted on a surface of a non-illustrated second board. The board-to-board connector according to the present embodiment includes the first connector 1 and the second connector 101, and is configured to electrically connect the first board and the second board with each other. Here, the first board and the second board are for example printed circuit boards, flexible flat cable, flexible printed circuit, and the like, used in an electronic device or apparatus, and may be any type of board.

Figure 3:
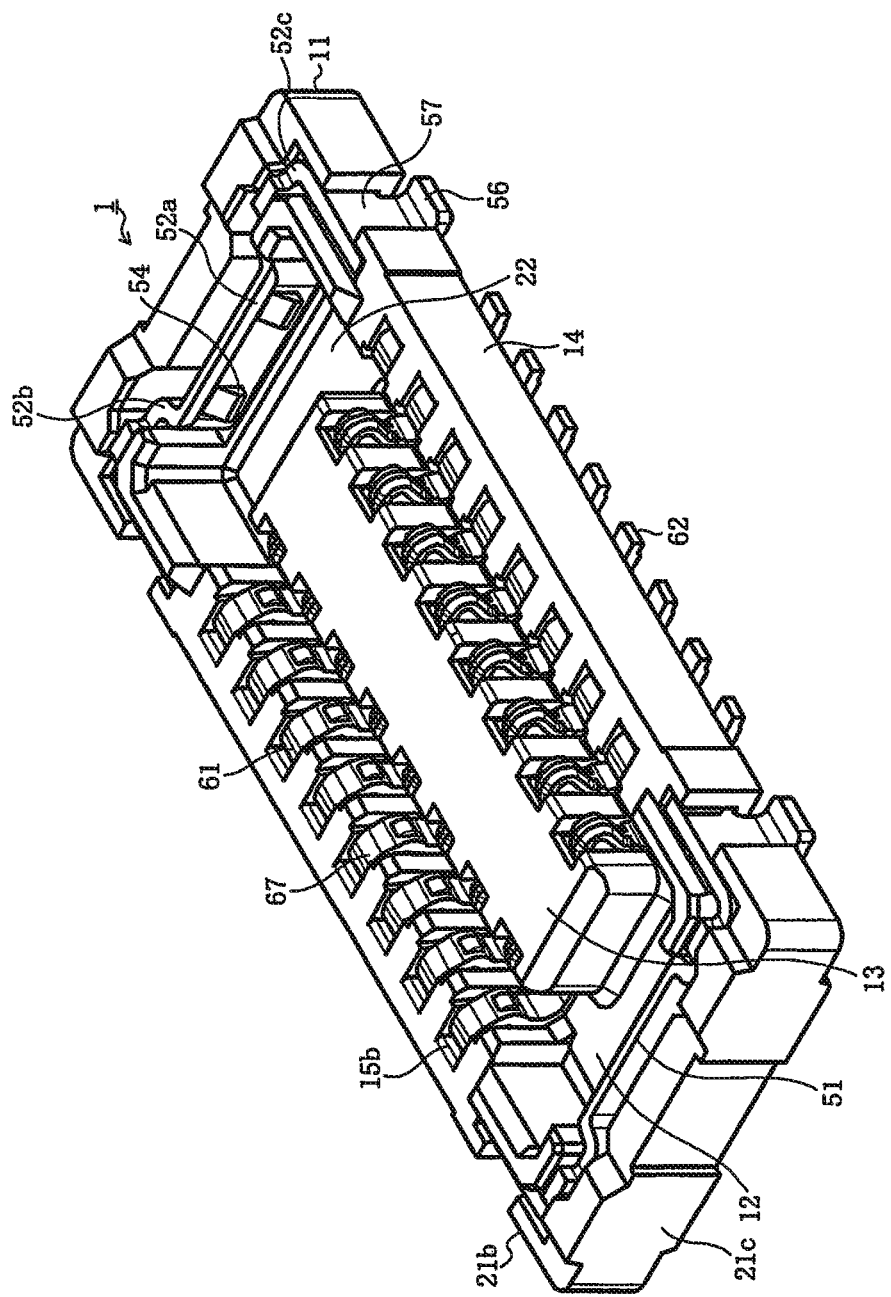
FIG. 3 is a perspective view of the first connector, viewed from a fitting face thereof.

The first connector 1 includes a first housing 11 as a connector body integrally formed of an insulating material. As will be understood from the drawing figures, the first housing 11 is a generally rectangular parallelepiped member having a generally rectangular, thick plate-like shape. A concave portion 12 having a generally rectangular shape having a surrounded perimeter is formed on a side, i.e., a fitting face side (the upper side in FIGS. 3), where the second connector 101 is fitted. The first connector 1 has a dimension of about 10.0 mm in length, about 2.5 mm in width, and about 1.0 mm in thickness, and the dimension may be appropriately changed. Moreover, a first protrusive convex portion 13 as an island portion is formed in the concave portion 12 to be integral with the first housing 11. Furthermore, side wall portions 14 configured to extend in parallel to the first protrusive convex portion 13 are formed at both sides of the first protrusive convex portion 13 to be integral with the first housing 11. In this case, the first protrusive convex portion 13 and the side wall portions 14 protrude upwardly from the bottom surface of the concave portion 12 and extend in the longitudinal direction of the first housing 11. Owing to this configuration, recessed groove portions 12a, as a portion of the concave portion 12, being elongated concave portions configured to extend in the longitudinal direction of the first housing 11 are formed at both sides of the first protrusive convex portion 13 to be disposed between the first protrusive convex portion 13 and the side wall portions 14. Although in the example illustrated, the first protrusive convex portion 13 is singular in number, a plurality of first protrusive convex portions 13 may be provided and the number thereof is not particularly limited. In addition, the first protrusive convex portion 13 has a dimension of about 0.6 mm in width, for example, the dimension may be appropriately changed.

In this embodiment, first terminal-receiving inside cavities 15a having a recessed groove shape are formed on both side surfaces of the first protrusive convex portion 13. Moreover, first terminal-receiving outside cavities 15b having a recessed groove shape, respectively, are formed on inner side surface of the side wall portion 14. Since the first terminal-receiving inside cavities 15a and the first terminal-receiving outside cavities 15b are connected with each other at a bottom surface of the recessed groove portion 12a and are integral with each other, the first terminal-receiving inside cavities 15a and the first terminal-receiving outside cavities 15b will be collectively referred to as first terminal receiving cavities 15.

The number of first terminal receiving cavities 15 on each side of the first protrusive convex portion 13 is 8, with a pitch of about 0.4 mm, for example. Moreover, the number of first terminals 61 received in the first terminal receiving cavities 15 on each side of the first protrusive convex portion 13, is 8 with a pitch of about 0.4 mm, for example. It should be appreciated that the pitch and the number of first terminal receiving cavities 15 may be appropriately changed.

The first terminals 61 are an integral member formed, by applying e.g., punching and bending to a conductive metallic plate. Each of the first terminals 61 is provided with a holding portion 63, a tail portion 62 connected to a lower end of the holding portion 63, an upper connection portion 67 connected to an upper end of the holding portion 63, a second contact portion 66 formed in the vicinity of an inner end of the upper connection portion 67, a lower connection portion 64 connected to the second contact portion 66, and a first contact portion 65 formed in the vicinity of a free end of the lower connection portion 64.

The holding portions 63 are portions that extend in the up-down direction, i.e., in the thickness direction of the first housing 11 to be held by being fitted in the first terminal-receiving outside cavities 15b. The tail portions 62 are bent to be connected to the holding portions 63 and extend in the left-right direction, i.e., outwardly in the width direction of the first housing 11 to be connected to connection pads connected to a conductive trace on the first board by means of soldering or the like. The upper connection portions 67 are bent to be connected to the holding portions 63 and extend inwardly in the width direction of the first housing 11.

The second contact portions 66, having a curved shape, configured to downwardly bend and protrude toward the inner side in the width direction of the first housing 11, are formed at the inner ends of the upper connection portions 67. The lower connection portions 64 have a general U-shape in side view and are connected to the lower ends of the second contact portions 66. Furthermore, the first contact portions 65 having a curved shape and configured to bend in an U shape and outwardly protrude in the width direction of the first housing 11 are formed at the free ends, i.e., in the vicinity of the inner upper ends of the lower connection portions 64.

The first terminals 61 are fitted into the first terminal receiving cavities 15 from the mounting side(the lower side in FIG. 3) to be fixedly secured to the first housing 11 when the holding portions 63 are clamped by the side walls of the first terminal-receiving outside cavities 15b in a sandwich manner, which are formed side surface of inside the side wall portions 14. In this state, that is, a state where the first terminals 61 are mounted in the first housing 11, the first contact portions 65 and the second contact portions 66 are positioned on both left and right sides of the recessed groove portion 12a so as to oppose each other.

Since the first terminals 61 are integrally formed by applying processing to a metal plate, they have some degree of elasticity. As is obvious from the shape of the first terminals, the gap between the opposing first contact portions 65 and the second contact portions 66 is elastically changeable. Thus, when the second terminals 161 of the second connector 101 are inserted to be positioned between the first contact portions 65 and the second contact portions 66, the gap between the first contact portions 65 and the second contact portions 66 is elastically increased.

Furthermore, first protrusive end portions 21 are arranged at both ends in the longitudinal direction of the first housing 11, respectively. A concave protrusive end portion 22 of the concave portion 12 is formed in each of the first protrusive end portions 21. The concave protrusive end portions 22 are generally rectangular concave portions and are connected to both ends in the longitudinal direction of each of the recessed groove portions 12a. Moreover, the concave protrusive end portion 22 functions as a concave insertion portion in which a later-described second protrusive end portion 122 of the second connector 101 is inserted in a state where the first connector 1 and the second connector 101 are engaged by fitting together.

Each of the first protrusive end portions 21 is provided with sidewall extension portions 21b configured to extend in the longitudinal direction of the first housing 11 from both ends in the longitudinal direction of the side wall portion 14 and an end wall portion 21c configured to extend in the short-axis direction of the first housing 11 and having both ends thereof connected to the sidewall extension portions 21b. In each of the first protrusive end portions 21, the end wall portion 21c and the sidewall extension portions 21b connected to both ends of the end wall portion 21c form a continuous side wall having an inverted C shape to thereby define three sides of the rectangular concave protrusive end portion 22.

Furthermore, first reinforcing brackets 51 are attached to the first protrusive end portions 21. The first reinforcing brackets 51 are arranged at the vicinity of the outer ends in longitudinal direction of the first housing 11 of the concave protrusive end portion 22, and are received and held in first concave bracket holding portions 26 formed in the sidewall extension portions 21b.

In the illustrated example, the first reinforcing brackets 51 are integrally formed by applying processing, e.g., punching and bending, to a metal plate. Each of the first reinforcing brackets 51 is provided with a first body portion 52 which generally has an elongated strip shape and is configured to extend in the width direction of the first housing 11, first arm portions 57 which are configured to bend to be connected to both left and right ends of the first body portion 52 and extend in the longitudinal direction of the first housing 11 to be held in the first housing 11, a first board connection portion 56 which is connected to a lower end of each of the first arm portions 57, and the first locking portions 54 which are formed in the first body portion 52.

The first body portion 52 is provided with a central portion 52a configured to extend in a straight-line shape along the width direction of the first housing 11 as viewed from the insertion/removal direction of the first and second connectors 1 and 101, namely the vertical direction, bent portions 52b which are configured to bend in a crank shape as viewed from the vertical direction to be connected to both ends of the central portion 52a; and outer end portions 52c configured to extend in a straight-line shape along the width direction of the first housing 11 and extend in the width direction of the first housing 11 from the bent portions 52b. Moreover, in the example illustrated in the drawing figure, the bent portions 52b are bent so that the central portion 52a is positioned closer to the center in the longitudinal direction of the first housing 11 than the outer end portions 52c. However, the outer end portions 52c may be positioned closer to the center in the longitudinal direction of the first housing 11 than the central portion 52a.

Furthermore, although in the example illustrated, a pair of first locking portions 54 is formed in the central portion 52a, the number of first locking portions 54 may be single and may be three or more, and the number thereof is not particularly limited. In addition, although the positions of the first locking portions 54 can be determined arbitrarily, they are typically arranged horizontally symmetrically with respect to the central axis in the width direction of the first housing 11. That is to say, when the number of first locking portions 54 is odd, one of them is positioned on the central axis in the width direction of the first housing 11 and the remaining halves are equally arranged on the left and right sides so that they are horizontally symmetrical with respect to the central axis. When the number of first locking portions 54 is even, they are equally arranged on the left and right sides so that they are horizontally symmetrical with respect to the central axis. In addition, although in the example illustrated in the drawing figure, the first locking portions 54 are convex portions configured to protrude outwardly from the surface of the central portion 52a, they are not necessarily convex portions as long as they have such a shape that they can be engaged with later-described second locking portions 154. For example, when the second locking portions 154 are convex portions, the first locking portions 54 may be concave or opening portions capable of being engaged with the convex portions. However, in the present embodiment, for the sake of explanation, description will be made for the case where the first locking portions 54 are a pair of convex portions and arranged horizontally symmetrically with respect to the central axis in the width direction of the first housing 11.

Each of the first arm portions 57 is configured to extend from an outer end of each of the outer end portions 52c toward the center in the longitudinal direction of the first housing 11 and is provided with a first concave and convex lock-latching portion 57a at a free end thereof. Furthermore, the first board connection portions 56 are connected to the lower ends of the first arm portions 57 so that a free end of each of the first board connection portions 56 is bent outwardly in the width direction of the first housing 11. The first board connection portions 56 function as solder tail portions of the first reinforcing brackets 51, and lower surfaces thereof are formed to be substantially parallel with a non-illustrated mounting surface of the first housing 11 and are fixedly secured to fixing pads on the first board by means of soldering or the like.

Each of the first concave bracket holding portions 26 is provided with groove-shaped outer end portion-receipt portions 26a configured to extend in the thickness and width directions of the first housing 11, first groove-shaped arm portion-receipt portion 26b configured to extend in the thickness and longitudinal directions of the first housing 11 and formed in the sidewall extension portions 21b to be connected to the outer end portion-receipt portion 26a, first lock-latched portions 26c arranged at the end portions of the first arm portion-receipt portions 26b, close to the center in the longitudinal direction of the first housing 11 and configured to be latched by the first lock-latching portions 57a, and connection portion-receipt opening portions 26d configured to be connected to the first arm portion-receipt portions 26b and opened to the outer surfaces of the sidewall extension portions 21b so that the first board connection portions 56 can be seen from the outside.

In a state where the first reinforcing brackets 51 are attached to the first protrusive end portions 21, almost the entire bodies thereof are received in the first concave bracket holding portions 26. However, a surface of the central portion 52a of the first body portion 52 at the center in the longitudinal direction of the first housing 11 is exposed to the concaved protrusive end portions 22 together with the first locking portions 54. Moreover, the first board connection portions 56 and outer side surfaces of the first arm portions 57 located above the first board connection portions 56 are exposed to the connection portion-receipt opening portions 26d.

The second connector 101 includes a second housing 111 as a connector body integrally formed of an insulating material such as synthetic resin. As will be understood from the drawing figure, the second housing 111 is a generally rectangular parallelepiped member having a generally rectangular, thick plate-like shape. The second housing 111 has a dimension of about 8.0 mm in length, about 1.5 mm in width, and about 0.8 mm in thickness, and the dimension may be appropriately changed as required. Moreover, an elongated recessed cavity portion 113 configured to extend in the longitudinal direction of the second housing 111 and second protrusive convex portions 112 as an elongated protrusive convex portion configured to define the outer sides of the recessed cavity portion 113 and extend in the longitudinal direction of the second housing 111 are integrally formed on a side, i.e., a fitting face side (the upper side in FIGS. 4 and 5) of the second housing 111 where the first connector 1 is fitted. The second protrusive convex portions 112 are formed along both sides of the recessed cavity portion 113 and along both sides of the second housing 111. Moreover, second terminals 161 as a terminal are arranged in each of the second protrusive convex portions 112.

As illustrated in the drawing figure, the recessed cavity portion 113 is closed by a bottom portion at a surface thereof on a side, i.e., a mounting surface (the lower surface in FIGS. 4 and 5) where it is mounted on the second board. Moreover, although in the example illustrated in the drawing figure, the number of second protrusive convex portions 112 is two, it may be singular in number and the number thereof is not particularly limited. The recessed cavity portion 113 has a dimension of about 0.7 mm in width, for example, and the dimension thereof may be appropriately changed as required.

The second terminals 161 are an integral member formed by applying processing, e.g., punching and bending to a conductive metal plate. Each of the second terminals 161 is provided with a non-illustrated body portion, a tail portion 162 connected to a lower end of the body portion, a first contact portion 165 connected to an upper end of the body portion, a connection portion 164 connected to an upper end of the first contact portion 165, and a second contact portion 166 connected to an outer end of the connection portion 164. Moreover, first concave contact portions 165a configured to be engaged with the first contact portions 65 of the first terminals 61 are formed on the surface of the first contact portions 165, and second concave contact portions 166a configured to be engaged with the second contact portions 66 of the first terminals 61 are formed on the surface of the second contact portions 166.

Figure 4:
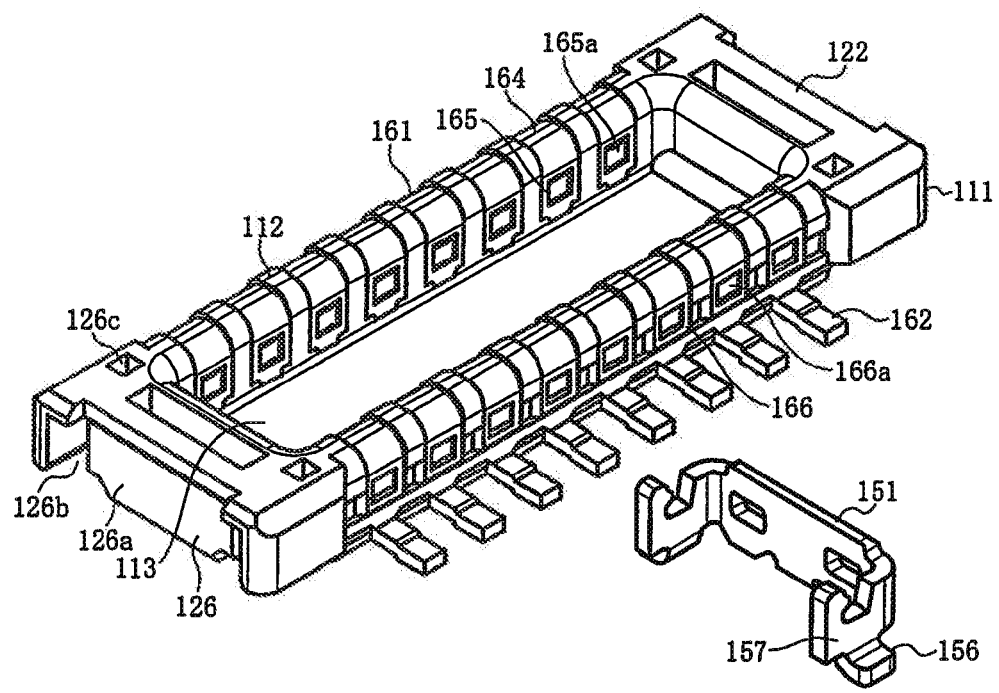
FIG. 4 is an exploded view of the second connector, viewed from a fitting face thereof.
Figure 4:
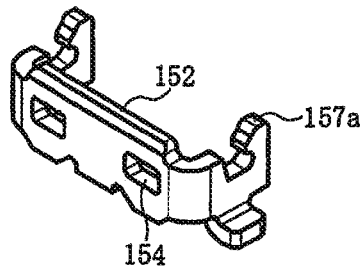
Figure 5:
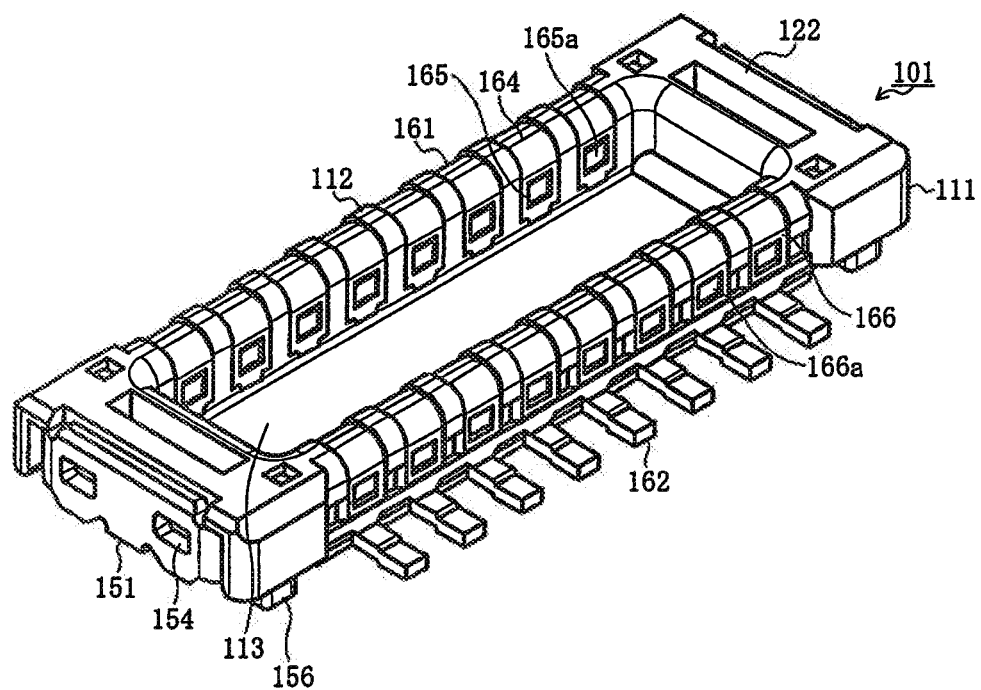
FIG. 5 is a perspective view of the second connector, viewed from a fitting face thereof.

The body portion is a portion which is held in a state where a perimeter thereof is surrounded by the second housing 111 and is not illustrated in FIGS. 4 and 5. Moreover, the tail portions 162 are connected to the lower ends of the second terminals 161 which extend in the horizontal direction of the body portion, namely the width direction of the second housing 111, and are extended outwardly from the second housing 111 to be connected to connection pads connected to a conductive trace on the second board by means of soldering or the like. The first contact portions 165 are flat plate-like portions that are connected to the body portions so as to extend in the vertical direction, namely in the thickness direction of the second housing 111. The connection portions 164 are bent to be connected to the first contact portions 165 and extend outwardly in the width direction of the second housing 111. The second contact portions 166 are portions that are bent downwardly to be connected to the outer ends of the connection portions 164 so as to extend downwardly.

The second terminals 161 are integrated with the second housing 111 by means of over-molding. That is to say, the second housing 111 is formed by filling resin in a cavity of a mold having the second terminals 161 being set therein. In this way, the second terminals 161 are integrally attached to the second housing 111 in a state where the body portions are buried in the second housing 111, and the surfaces of the first contact portions 165 and the connection portions 164, and the second contact portions 166 are exposed to the respective lateral surfaces of the second convex portions 112 and the fitting surfaces. In this case, the number of second terminals 161 arranged in the second housing 111 is 16 with a pitch of about 0.4 mm, for example. Moreover, the pitch and the number of the second terminals 161 are appropriately changed.

Furthermore, second protrusive end portions 122 as a second fitting guide portion are arranged at both ends in the longitudinal direction of the second housing 111, respectively. Each of the second protrusive end portions 122 is a thick member that extends in the width direction of the second housing 111 and has both ends thereof connected to both ends in the longitudinal direction of the second protrusive convex portion 112, and an upper surface thereof has a generally rectangular shape. Moreover, the second protrusive end portions 122 function as convex insertion portions which are inserted in the concave protrusive end portions 22 of the first protrusive end portions 21 of the first connector 1 in a state where the first connector 1 and the second connector 101 are engaged by fitting together.

Furthermore, second reinforcing brackets 151 as a reinforcing bracket are attached to the second protrusive end portions 122. The second reinforcing brackets 151 are arranged along the outer ends in the longitudinal direction of the second housing 111 of the second protrusive end portion 122, and are received and held in second concave bracket holding portions 126 formed in the second protrusive end portion 122.

In the present embodiment, the second reinforcing brackets 151 are an integral member formed by applying processing, e.g., punching and bending, to a metal plate. Each of the second reinforcing brackets 151 is provided with a second body portion 152 which generally has an elongated strip shape and is configured to extend in the width direction of the second housing 111, second arm portions 157 which are configured to bend to be connected to both left and right ends of the second body portion 152 and extend in the longitudinal direction of the second housing 111 to be held in the second housing 111, a second board connection portion 156 which is connected to a lower end of each of the second arm portions 157, and second locking portions 154 which are formed in the second body portion 152.

Although in the example illustrated in the drawing figure, a pair of second locking portions 154 is formed in the second body portion 152, the number of second locking portions 154 may be single and may be three or more, and the number thereof is not particularly limited but is set so as to correspond to the number of first locking portions 54 of the first reinforcing brackets 51. Furthermore, the arrangement of the second locking portions 154 is set so as to correspond to the arrangement of the first locking portions 54, and they are typically arranged horizontally symmetrically with respect to the central axis in the width direction of the second housing 111. In addition, although in the example illustrated in the drawing figure, the second locking portions 154 are opening portions that penetrate through the second body portion 152 in the thickness direction, the second locking portions 154 may be concave portions configured to be depressed from the surface of the second body portion 152 but are not necessarily opening portions as long as they have a shape capable of being engaged with the first locking portions 54. For example, when the first locking portions 54 are concave or opening portions, the second locking portions 154 may be convex portions configured to be capable of being engaged with the concave or opening portions. However, in the present embodiment, for the sake of explanation, description will be made of the case where the second locking portions 154 are a pair of opening portions and arranged horizontally symmetrically with respect to the central axis in the width direction of the second housing 111.

Each of the second arm portions 157 is configured to extend from either left or right end of each of the second body portion 152 toward the center in the longitudinal direction of the second housing 111 and is provided with a second lock-latching portion 157a at a free end thereof, which is configured to protrude upwardly. Furthermore, the second board connection portions 156 are connected to the lower ends of the second arm portions 157 so that a free end of each of the second board connection portions 156 is bent outwardly in the width direction of the second housing 111. The second board connection portions 156 function as solder tail portions of the second reinforcing brackets 151, and lower surfaces thereof are formed to be substantially parallel with a non-illustrated mounting surface of the second housing 111 and are fixedly secured to fixing pads on the second board by means of soldering or the like.

Each of the second concave bracket holding portions 126 is provided with second body portion-receipt portion 126a which are outer side surfaces of the second protrusive end portions 122 in the longitudinal direction of the second housing 111 and configured to extend in the thickness and width directions of the second housing 111, second groove-shaped arm portion-receipt portion 126b configured to extend in the thickness and longitudinal directions of the second housing 111 so as to be connected to both ends of each of the second body portion-receipt portions 126a, and second lock-latched portions 126c which are arranged at the end portions of the second arm portion-receipt portions 126b, close to the center in the longitudinal direction of the second housing 111 so as to extend in the vertical direction, and which have upper ends thereof being opened to the surfaces of the second protrusive end portions 122 and are configured to be latched by the second lock-latching portions 157a.

In a state where the second reinforcing brackets 151 are attached to the second protrusive end portions 122, almost the entire bodies thereof are received in the second concave bracket holding portions 126. However, a surface of the second body portion 152 at the outside in the longitudinal direction of the second housing 111 is exposed to surfaces of the second protrusive end portions 122 at the outside in the longitudinal direction of the second housing 111 together with the second locking portions 154. Moreover, the lower surfaces of the second board connection portions 156 are exposed to the mounting surface of the second housing 111. On the other hand, in a state where the first connector 1 and the second connector 101 are engaged by fitting together, the second locking portion 154 is engaged with the first locking portion 54 of each of the first reinforcing brackets 51 of the first connector 1.

In this embodiment, the first connector 1 is assumed to be surface-mounted on the first board in a state where the tail portions 62 of the first terminals 61 are connected to a non-illustrated connection pads connected to a conductive trace on the first board by means of soldering or the like and the first board connection portions 56 of the first reinforcing brackets 51 are connected to the fixing pads on the first board by means of soldering or the like.

Similarly, the second connector 101 is assumed to be surface-mounted on the second board in a state where the tail portions 162 of the second terminals 161 are connected to the non-illustrated connection pads connected to a conductive trace on the second board by means of soldering or the like and the second board connection portions 156 of the second reinforcing brackets 151 are connected to the fixing pads on the second board by means of soldering or the like.

First, the operator manipulates the connectors so that the fitting face of the first connector 1 opposes the fitting face of the second connector 101. When the positions of the second protrusive convex portions 112 on the left and right sides of the second connector 101 correspond to the positions of the recessed groove portions 12a on the left and right sides of the first connector 1, the positioning between the first connector 1 and the second connector 101 is completed.

In such a state, when the operator moves the first connector 1 and/or the second connector 101 in a direction toward either one of the connectors, i.e., in the fitting direction, the second protrusive convex portions 112 on the left and right sides of the second connector 101 are received in the recessed groove portions 12a on the left and right sides of the first connector 1. Moreover, the second terminals 161 of the second connector 101 are positioned between the first contact portions 65 and the second contact portions 66 of the first terminals 61, so that the first contact portions 65 of the first terminals 61 contact the first contact portions 165 of the second terminals 161, and the second contact portions 66 of the first terminals 61 are brought into contact with the second contact portions 163 of the second terminals 161.

Figure 2:
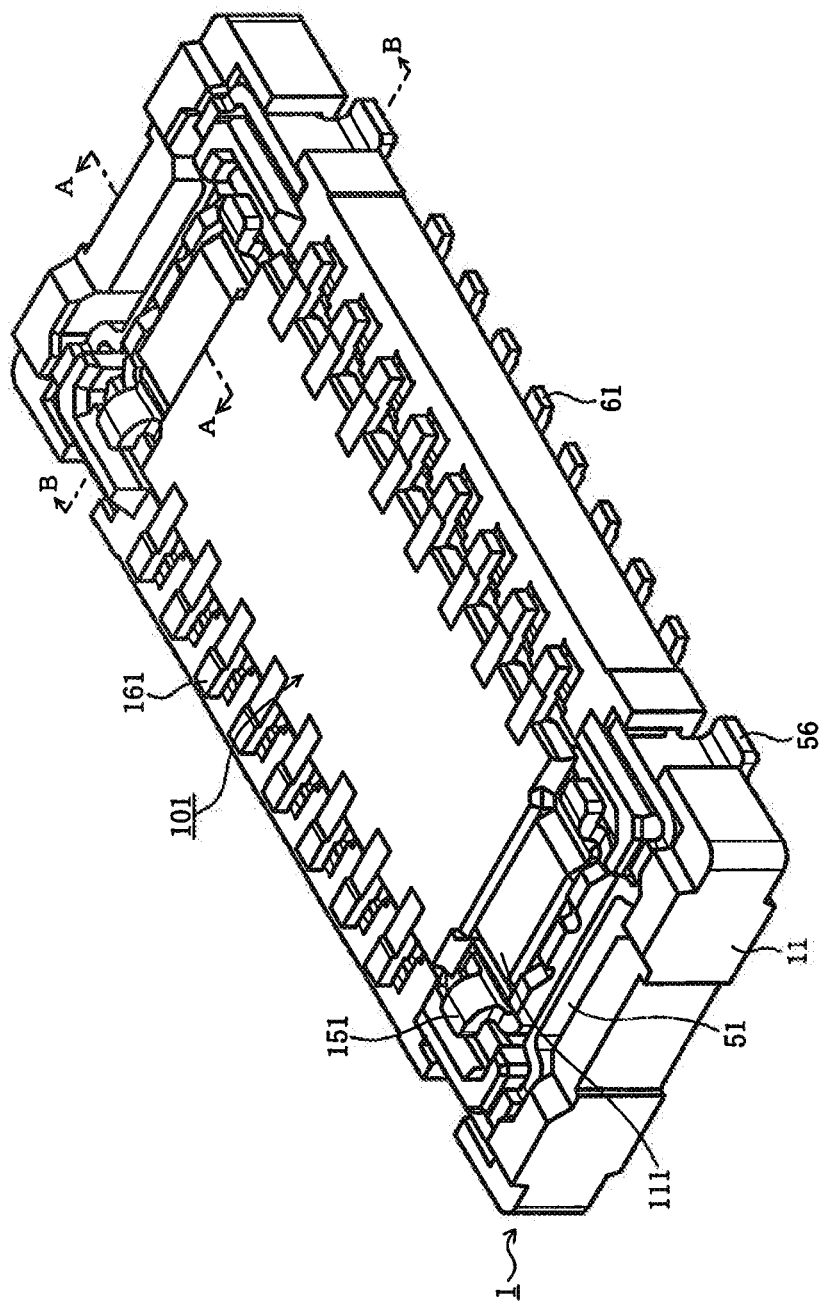
FIG. 2 is a perspective view of first and second connectors of the board-to-board connector according to the Present Application, wherein the connectors are engaged together by fitting, viewed from a fitting face of the first connector.

In this way, as illustrated in FIG. 2, when the fitting engagement between the first connector 1 and the second connector 101 is completed, the first terminals 61 and the second terminals 161 are electrically connected to each other. Specifically, the first contact portions 65 of the first terminals 61 are engaged with the first concave contact portions 165a of the second terminals 161, and the second contact portions 66 of the first terminals 61 are engaged with the second concave contact portion 166a of the second terminals 161. As a result, the conductive trace connected to the connection pads on the first board being connected to the tail portions 62 of the first terminals 61 are electrically connected to the conductive trace connected to the connection pads on the second board being connected to the tail portions 162 of the second terminals 161. In this case, since the first terminals 61 and the second terminals 161 make multi-point contact with each other, it is possible to certainly maintain stable electrical connection.

Figure 6A:
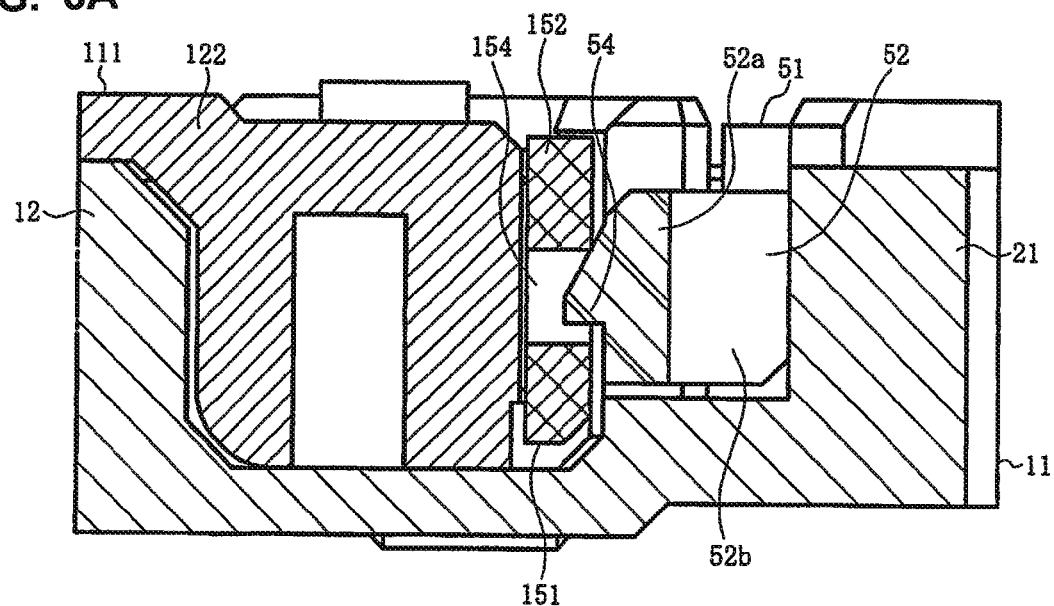

Moreover, as illustrated in FIGS. 6 and 7, the first reinforcing brackets 51 of the first connector 1 and the second reinforcing brackets 151 of the second connector 101 are locked by being engaged with each other. In this case, the first locking portions 54 of the first reinforcing brackets 51, which are convex portions, are inserted in the second locking portions 154 of the second reinforcing brackets 151, which are opening portions, and the first locking portions 54 are engaged with the second locking portions 154, whereby the first connector 1 and the second connector 101 are locked.

Therefore, it is difficult to remove the second connector 101 from the first connector 1 even upon receipt of a force that releases the fitting engagement between the first connector 1 and the second connector 101, that is, upon receipt of a removal force for removing the second connector 101 from the first connector 1. That is, a necessary removal force is increased.

Figure 6B:
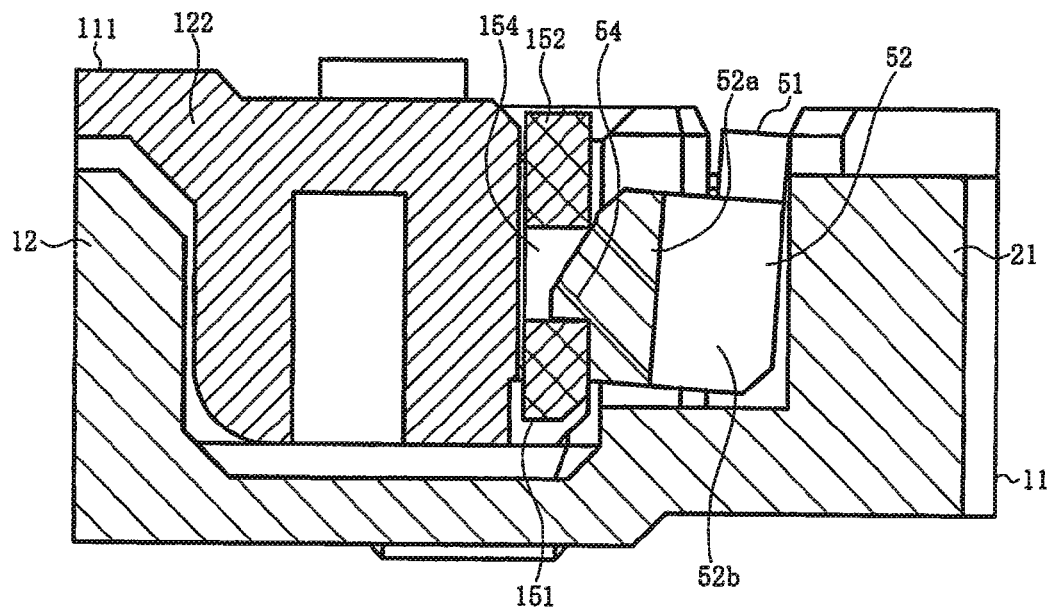
Figure 7A:
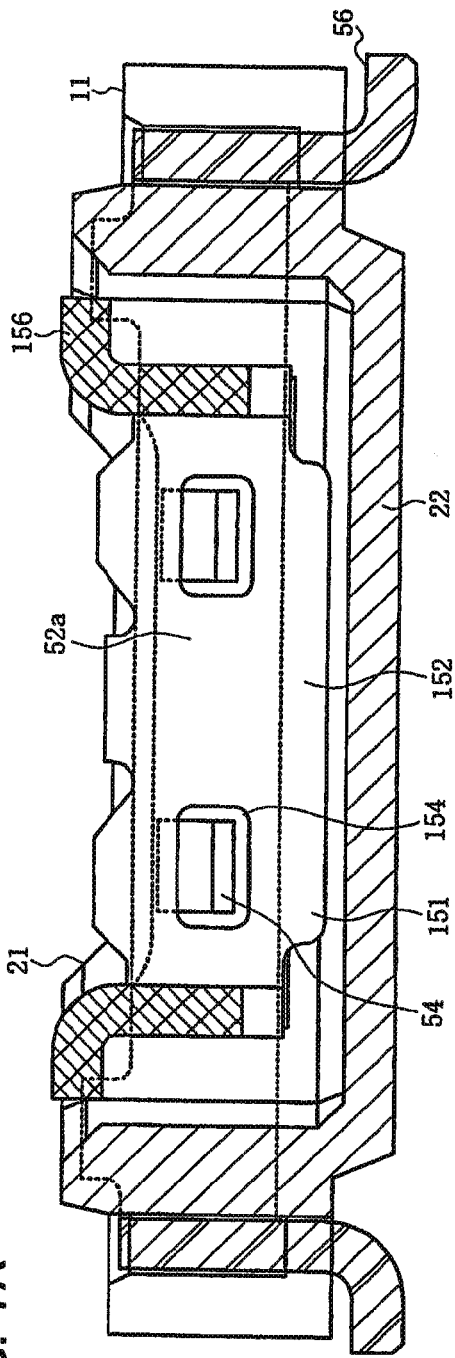
Figure 7B:
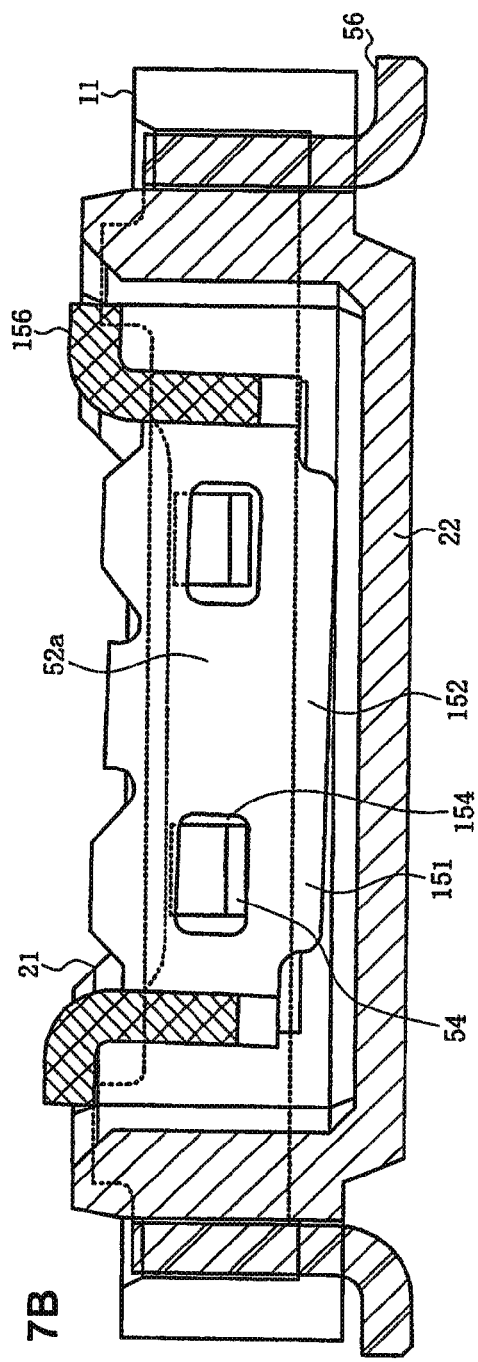
Figure 8:
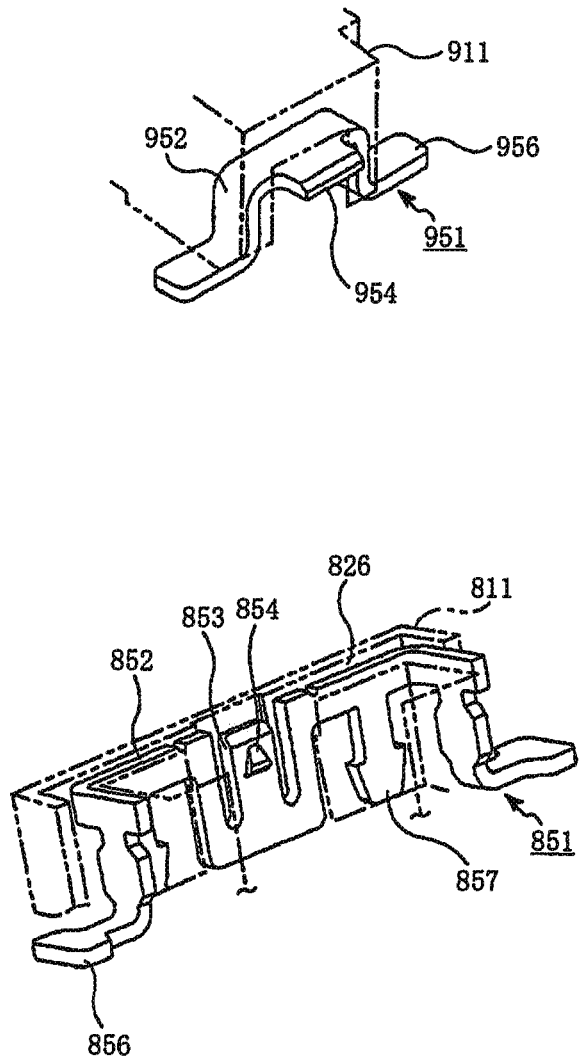
FIG. 8 is a perspective view of a conventional board-to-board connector.

Here, when the states of the first reinforcing bracket 51 and the second reinforcing bracket 151 upon receipt of a removal force are observed closely, it can be understood from FIG. 6B that the first body portion 52 of the first reinforcing bracket 51 is torsionally deformed. As will be obvious from comparison with FIG. 6A, this is because upon receipt of the removal force, the second reinforcing bracket 151 is raised relative to the first reinforcing bracket 51, so that the first locking portion 54, engaged with the second locking portion 154, receives a force that displaces the first locking portion 54 upwardly. Thus, the first body portion 52 receives a torsional moment.

When the removal force is large, the amount of torsional deformation of the first body portion 52 becomes large, and the engagement between the first locking portion 54 and the second locking portion 154 is released. As a result, the lock between the first connector 1 and the second connector 101 is released, and thus the engagement between the first connector 1 and the second connector 101 may be released.

However, in the present embodiment, the first body portion 52 is provided with the bent portion 52b that bends in a crank shape as viewed from the insertion/removal direction of the first and second connectors 1 and 101. More specifically, crank-shaped bent portions 52*b* are connected to both sides of the central portion 52*a* on which the first locking portions 54 are formed. Owing to such a configuration, the first body portion 52 has a high section modulus and a high torsional rigidity and is scarcely torsionally deformed. Therefore, even when the first body portion 52 receives a torsional moment, since the amount of torsional deformation of the first body portion 52 is small, the engagement between the first locking portion 54 and the second locking portion 154 is not released. That is to say, since the first body portion 52 has a high torsional rigidity due to the crank-shaped bent portion 52*b*, a necessary removal force is large and it is thus difficult to remove the second connector 101 from the first connector 1.

Furthermore, in the present embodiment, the first body portion 52 is provided with the pair of first locking portions 54 which are arranged on left and right sides thereof. Owing to such a configuration, the first left and right locking portions 54 are positioned close to the left and right bent portions 52*b* which have a high torsional rigidity. Therefore, even upon receipt of a force from the second locking portion 154, since the amount of upward displacement of the first locking portion 54 is small, the engagement between the first locking portion 54 and the second locking portion 154 is not released. That is to say, since the first locking portion 54 is positioned close to the crank-shaped bent portion 52*b*, a necessary removal force is further increased, and it becomes further difficult to remove the second connector 101 from the first connector 1. When the number of first locking portions 54 is three or more, the force applied to each of the first locking portions 54 will be decreased further, and it becomes further difficult to remove the second connector 101 from the first connector 1.

The second body portion 152 of the second reinforcing bracket 151 receives a torsional moment similar to the first body portion 52 of the first reinforcing bracket 51. However, the dimension of the second body portion 152 in the width direction of the second housing 111 is extremely small compared to the first body portion 52. Therefore, the amount of torsional deformation of the second body portion 152 is supposed to be small even upon receipt of a torsional moment of the same magnitude. Thus, in the present embodiment, the same crank-shaped portion as the bent portion 52*b* is not formed in the second body portion 152. Nevertheless, when it is necessary to decrease further the amount of torsional deformation of the second body portion 152, the same crank-shaped bent portion as the bent portion 52*b* may be formed in the second body portion 152.

Furthermore, under practical use condition, the direction of the removal force may be oblique to the insertion/removal direction of the first and second connectors 1 and 101. That is, an oblique removal force may be applied. Here, when the states of the first reinforcing bracket 51 and the second reinforcing bracket 151 upon receipt of an oblique removal force are observed closely, it can be understood from FIG. 7B, the second body portion 152 of the second reinforcing bracket 151 is sloped with respect to the first body portion 52 of the first reinforcing bracket 51. As will be obvious from comparison with FIG. 7A, upon receipt of a removal force, one end (the left end) in the width direction of the second body portion 152 is raised relative to the first body portion 52. That is to say, a rotational moment acts on the second body portion 152 in a direction (clockwise direction in the example illustrated in the drawing figure) of rotating the second body portion 152 about an axis perpendicular to the drawing sheet and extending along the center in the width direction of the second body portion 152.

As described above, when an oblique removal force is applied, a force caused by the rotational moment is applied to the first locking portion 54 and the second locking portion 154 in addition to the above-mentioned force that raises the second reinforcing bracket 151 relative to the first reinforcing bracket 51. Thus, it becomes easy to release the engagement between the first locking portion 54 and the second locking portion 154.

However, in the present embodiment, the first body portion 52 and the second body portion 152 are respectively provided with the pair of first locking portions 54 and the pair of second locking portions 154 which are arranged on the left and right sides, respectively. Owing to such a configuration, the first locking portions 54 and the second locking portions 154 are arranged at positions separated from the central axis of the rotational moment. Therefore, an upward urging force caused by the rotational moment applied to the first locking portion 54 at one end (the left end in the example illustrated in the drawing figure) in the width direction is small, and thus the engagement between the first locking portion 54 and the second locking portion 154 is not released. That is to say, since the first locking portion 54 and the second locking portion 154 are separated from the center in the width direction, the influence of the force caused by the rotational moment is decreased even upon receipt of the oblique removal force, and it is thus difficult to remove the second connector 101 from the first connector 1. When the numbers of first locking portions 54 and second locking portions 154 are respectively three or more, the force applied to each of the first locking portions 54 will be decreased further, and it becomes further difficult to remove the second connector 101 from the first connector 1.

The first reinforcing brackets 51 and the second reinforcing brackets 151 can be used as ground terminals. In this case, the first board connection portions 56 of the first reinforcing brackets 51 are connected to connection pads, which are connected to the ground line on the first board, by means of soldering or the like, and the second board connection portions 156 of the second reinforcing brackets 151 are connected to connection pads, which are connected to the ground line on the second board, by means of soldering or the like.

As described above, in the present embodiment, at least one of the first reinforcing brackets 51 and the second reinforcing brackets 151 is provided with the bent portion 52*b* having a crank shape as viewed from the insertion/removal direction of the first and second connectors 1 and 101. Owing to such a configuration, deformation of the first reinforcing brackets 51 and/or the second reinforcing brackets 151 is prevented, and a firm engagement state between the first reinforcing brackets 51 and the second reinforcing brackets 151 can be achieved. As a result, a strong removal force is required for releasing the engagement state, and a stable engagement between the first connector 1 and the second connector 101 can be maintained. Accordingly, it is possible to provide good operability and high reliability for the board-to-board connector.

Moreover, each first reinforcing bracket 51 is provided with the first strip-shaped body portion 52, configured to extend in the width direction of the first housing 11 and the first locking portion 54 which is formed on the first body portion 52. Each of the second reinforcing brackets 151 is provided with the second strip-shaped body portion 152, which is configured to extend in the width direction of the second housing 111, and the second locking portion 154 which is formed on the second body portion 152 and which is configured to be engaged with the first locking portion 54. One of the first locking portion 54 and the second locking portion 154 is a convex portion, and the other one is a concave portion or an opening portion. Owing to such a configuration, the first locking portion 54 and the second locking portion 154 can be engaged firmly, and the first connector 1 and the second connector 101 can be locked firmly.

Furthermore, the first locking portion 54 and the second locking portion 154 are provided plural in number, respectively, and at least two of them are arranged horizontally symmetrical. Owing to such a configuration, even when an oblique removal force is applied, the influence of a force caused by a rotational moment is decreased, and a stable engagement between the first connector 1 and the second connector 101 can be maintained.

Furthermore, each of the first reinforcing brackets 51 is provided with the first arm portions 57 which are connected to both ends of the first body portion 52 and configured to extend in the longitudinal direction of the first housing 11 to be held in the first housing 11. Each of the second reinforcing brackets 151 is provided with the second arm portions 157 which are connected to both ends of the second body portion 152 and configured to extend in the longitudinal direction of the second housing 111 to be held in the second housing 111. Owing to such a configuration, the first reinforcing brackets 51 and the second reinforcing brackets 151 have an increased rigidity and are prevented from being deformed, and thus a firm engagement state between the first reinforcing brackets 51 and the second reinforcing brackets 151 can be achieved. Moreover, since the first reinforcing brackets 51 and the second reinforcing brackets 151 are firmly held in the first housing 11 and the second housing 111, respectively, a stable engagement between the first connector 1 and the second connector 101 can be maintained.

Furthermore, the first body portion 52 is provided with the central portion 52a which is formed with the first locking portion 54 and configured to extend in a straight-line shape along the width direction of the first housing 11 as viewed from the insertion/removal direction; the pair of bent portions 52b which are connected to both ends of the central portion 52a; and the pair of outer end portions 52c which are configured to extend in the width direction of the first housing 11 from the bent portions 52b. Owing to such a configuration, since the first body portion 52 has a high section modulus and a high torsional rigidity and is thus hardly torsionally deformed, the engagement between the first locking portion 54 and the second locking portion 154 is not released. Therefore, a stable engagement between the first locking portion 54 and the second locking portion 154 can be maintained, and a stable lock state between the first connector 1 and the second connector 101 can be achieved.

Furthermore, the concave insertion portions 22 are formed at both ends in the longitudinal direction of the first housing 11; the first reinforcing brackets 51 are arranged at the vicinity of the outer ends of each concave insertion portion 22; the second protrusive end portions 122 are formed at both ends in the longitudinal direction of the second housing 111; and the second reinforcing brackets 151 are arranged along the outer ends in the longitudinal direction of each of the second protrusive end portions 122. Owing to such a configuration, the first reinforcing brackets 51 and the second reinforcing brackets 151 are engaged together at both ends in the longitudinal direction of the first housing 11 and the second housing 111, respectively, and the first reinforcing brackets 51 and the second reinforcing brackets 151 are entirely in a stable engagement state. As a result, a strong removal force is required for releasing the engagement state, and thus, a further stable engagement between the first connector 1 and the second connector 101 can be achieved.

While a preferred embodiment of the Present Application is shown and described, it is envisioned that those skilled in the art may devise various modifications without departing from the spirit and scope of the foregoing Description and the appended Claims.

What is claimed is:

1. A board-to-board connector comprising:
a first connector, the first connector including first terminals, a first housing having a generally rectangular parallelepiped shape and concave insertion portions, and first reinforcing brackets disposed at opposite ends of the first housing and communicating with the concave insertion portions; and
a second connector, the second connector including second terminals configured to contact the first terminals, a second housing having a generally rectangular parallelepiped shape and convex insertion portions inserted into the concave insertion portions, and second reinforcing brackets arranged along the convex insertion portions and engaging the first reinforcing brackets when the first and second connectors are mated together;
wherein each of the first reinforcing brackets includes a body portion, the body portion including a central portion and a pair of outer end portions extending in a widthwise direction, the body portion further including a pair of bent portions extending at angles to the central and outer end portions and interconnecting the central and outer end portions together such that the central portion is longitudinally offset with respect to the outer end portions.

2. The board-to-board connector according to claim 1, wherein the first reinforcing bracket central and outer end portions are parallel.

3. The board-to-board connector according to claim 1, wherein each of the second reinforcing brackets includes a body portion extending in a widthwise direction and a pair of second arm portions extending longitudinally from opposite ends of the body portion.

4. The board-to-board connector according to claim 3, wherein the second reinforcing bracket body portion form part of the second housing convex insertion portions.

5. The board-to-board connector of claim 1, wherein each central portion includes a first locking portion disposed thereon.

6. The board-to-board connector according to claim 5, wherein the first reinforcing brackets each include a pair of arm portions extending longitudinally from the
outer end portions and engaging the first housing.

7. The board-to-board connector according to claim 6, wherein the first reinforcing bracket arm portions include tail portions for attaching to a surface of a circuit board.

8. A board-to-board connector assembly, comprising:
a first connector, the first connector including an insulative housing supporting a plurality of conductive first terminals, the first connector housing having a generally rectangular parallelepiped shape and interior mating grooves, the first connector housing further including, at opposite ends thereof, first reinforcing brackets which communicate with some of the first connector housing mating grooves;
a second connector, mateable with the first connector, the second connector including an insulative housing supporting a plurality of conductive terminals, the second terminals configured to contact the first terminals when the first and second connectors are mated together, the second connector housing having a generally rectangular parallelepiped shape and projecting insertion portions received in the first connector housing mating grooves when the first and second connectors are mated together, the second connector housing further including second reinforcing brackets forming parts of the projecting insertion portions and engaging the first reinforcing brackets when the first and second connectors are mated together; and wherein each first reinforcing bracket includes a body portion, the body portion including a central portion and a pair of outer end portions extending widthwise of the first connector housing, the first reinforcing bracket body portion further including a pair of bent portions extending at angles to the central and outer end portions and interconnecting the central and outer end portions together such that the central portion is longitudinally offset with respect to the outer end portions.

9. The board-to-board connector assembly of claim 8, wherein the first reinforcing bracket central portions form parts of the first connector housing mating grooves.

10. The board-to-board connector assembly of claim 8, wherein the first reinforcing bracket central portions are disposed on the first connector housing inwardly of the outer end portions.

11. The board-to-board connector assembly of claim 8, wherein the first connector housing mating grooves communicate with each other to define a continuous mating groove.

\* \* \* \* \*